(12) United States Patent
Yen et al.

(10) Patent No.: US 9,607,942 B2
(45) Date of Patent: Mar. 28, 2017

(54) SEMICONDUCTOR DEVICE WITH PATTERNED GROUND SHIELDING

(71) Applicant: Taiwan Semiconductor Manufacturing Company Limited, Hsin-Chu (TW)

(72) Inventors: Hsiao-Tsung Yen, Tainan (TW); Cheng-Wei Luo, Hsinchu (TW); Kung-Hao Liang, Taipei (TW); Chin-Wei Kuo, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/058,158

(22) Filed: Oct. 18, 2013

(65) Prior Publication Data
US 2015/0108603 A1 Apr. 23, 2015

(51) Int. Cl.
*H01L 23/522* (2006.01)
*H01L 49/02* (2006.01)

(52) U.S. Cl.
CPC ...... *H01L 23/5227* (2013.01); *H01L 23/5225* (2013.01); *H01L 28/10* (2013.01); *H01L 2924/0002* (2013.01)

(58) Field of Classification Search
CPC ...................................... H01L 28/10
See application file for complete search history.

(56) References Cited

U.S. PATENT DOCUMENTS

| | | | | |
|---|---|---|---|---|
| 6,452,249 | B1* | 9/2002 | Maeda et al. | 257/531 |
| 2001/0002329 | A1* | 5/2001 | Ling | 438/459 |
| 2005/0258507 | A1* | 11/2005 | Tseng et al. | 257/531 |
| 2009/0146636 | A1* | 6/2009 | Nakajima et al. | 323/311 |
| 2010/0078761 | A1* | 4/2010 | Hui | 257/531 |
| 2011/0241160 | A1* | 10/2011 | Kerber et al. | 257/528 |
| 2015/0084733 | A1* | 3/2015 | Sun et al. | 336/84 C |

* cited by examiner

*Primary Examiner* — Shaun Campbell
*Assistant Examiner* — Aneta Cieslewicz
(74) *Attorney, Agent, or Firm* — Cooper Legal Group, LLC

(57) ABSTRACT

Semiconductor devices and methods of formation are provided herein. A semiconductor device includes a first inductor, a patterned ground shielding (PGS) proximate the first inductor comprising one or more portions and a first switch configured to couple a first portion of the PGS to a second portion of the PGS. The semiconductor device also has a configuration including a first inductor on a first side of the PGS, a second inductor on a second side of the PGS and a first switch configured to couple a first portion of the PGS to a second portion of the PGS. Selective coupling of portions of the PGS by activating or deactivating switches alters the behavior of the first inductor, or the behavior and interaction between the first inductor and the second inductor. A mechanism is thus provided for selectively configuring a PGS to control inductive or other properties of a circuit.

20 Claims, 20 Drawing Sheets

SEMICONDUCTOR DEVICE WITH PATTERNED GROUND SHIELDING

BACKGROUND

Inductors are used in electronic circuits to function as, among other things, filters or transformers.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
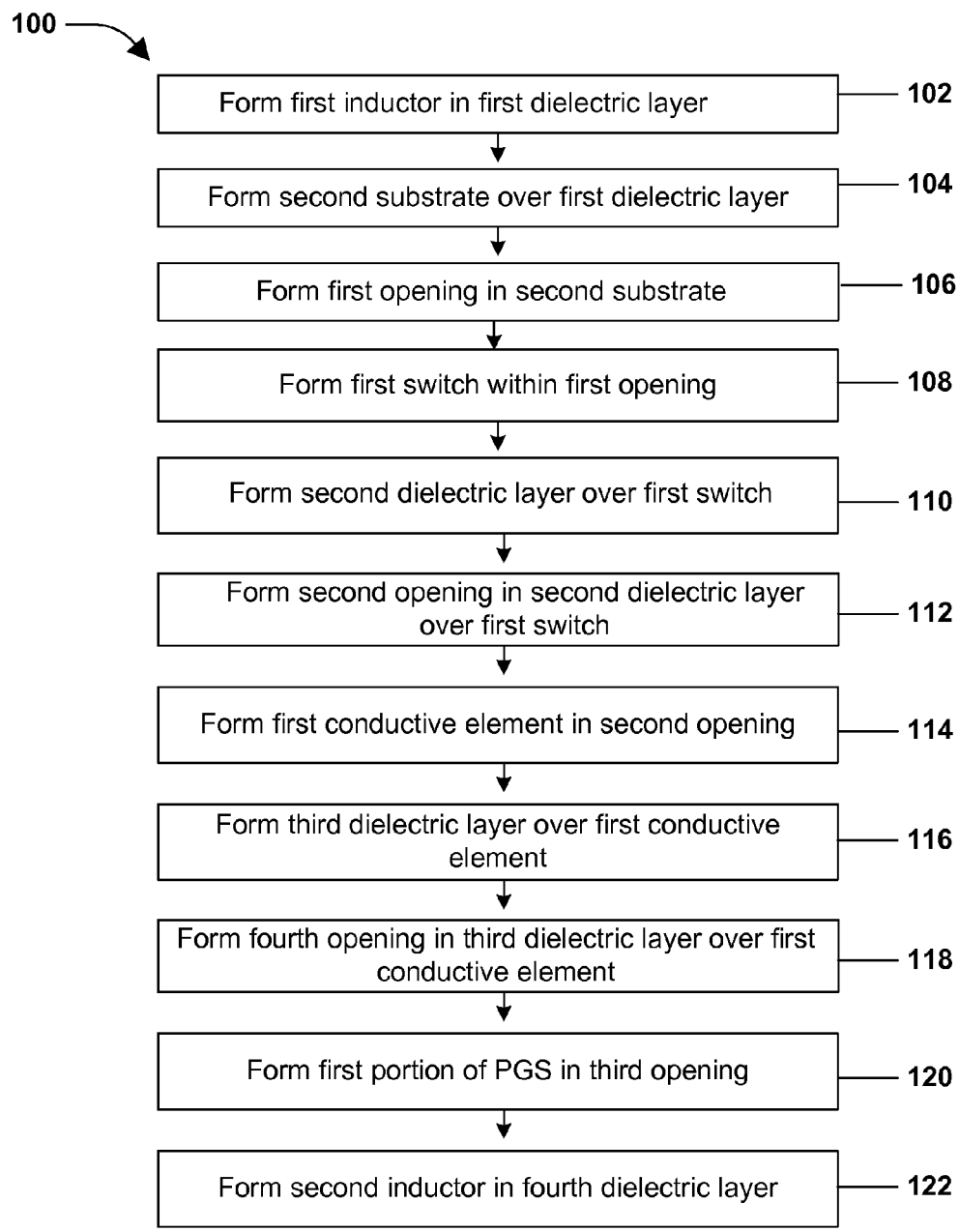
FIG. 1 is a flow diagram illustrating a method of forming a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

A semiconductor device comprising a first inductor, a patterned ground shielding (PGS) comprising one or more portions, and a first switch configured to couple a first portion of the PGS to a second portion of the PGS, as provided herein, is useful for various purposes, such as to induce variable inductance or form an RF choke for use in 3D integrated circuits. In some embodiments, the semiconductor device comprises at least one of a first inductor or a second inductor. In some embodiments, the PGS is situated between the first inductor and the second inductor. In some embodiments, the semiconductor device comprises at least one of a first substrate or a second substrate. In some embodiments, the PGS is situated between the second substrate and the second inductor. In some embodiments, the PGS is situated between the first substrate and the first inductor. In some embodiments, the PGS is situated between the first substrate and the second substrate. In some embodiments, the semiconductor device comprises at least one of a first switch or a second switch. In some embodiments, the first switch is not situated between the inductor and the PGS. In some embodiments, the first switch is situated in at least one of the first substrate or the second substrate. In some embodiments, the first switch is connected to the first portion of the PGS by a conductive element. In some embodiments, a switch comprises a conductive material. In some embodiments, the conductive material is metal. In some embodiments, the connective element passes through the second substrate.

One or more arrangements of a semiconductor device are provided herein. In some embodiments, a first switch is coupled to a first portion of a PGS. In some embodiments, a second switch is selectively coupled to a second portion of the PGS. In some embodiments, the first switch is selectively activated to alter the performance of at least one of a first inductor or a second inductor. In some embodiments, at least one of the first switch or second switch is connected to a voltage source. In some embodiments, the voltage source comprises ground. In some embodiments, selectively activating the first switch isolates a first frequency. In some embodiments, selectively activating the second switch isolates a second frequency. In some embodiments, the first frequency is a high frequency. In some embodiments, the second frequency is a low frequency. In some embodiments, selectively activating the first switch alters the behavior of an inductor to address process variations in the inductor.

In some embodiments, a first inductor is on a first side of a PGS and a first switch, and a second inductor is on a second side of the PGS and the first switch, and the first switch is configured to couple a first portion of the PGS to a second portion of a the PGS. In some embodiments, the first switch is connected to a voltage source. In some embodiments, the voltage source comprises ground. In some embodiments, the first inductor and second inductor form a transformer. In some embodiments, the application of the voltage source to at least some of the PGS through the first switch affects the behavior of the transformer.

Figure 4:
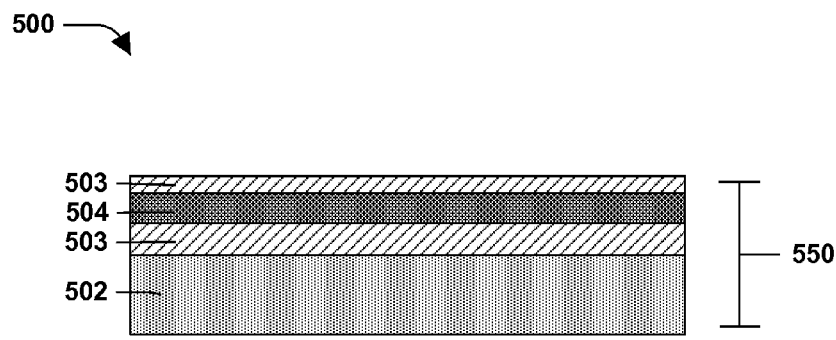
FIG. 4 is an illustration of a semiconductor device, according to some embodiments.

A first method 100 of forming a first semiconductor device 500 is illustrated in FIG. 1, and one or more semiconductor arrangements formed by such methodology are illustrated in FIGS. 4-19. As illustrated in FIG. 19, the first semiconductor device 500 comprises one or more portions of a patterned ground shielding (PGS) 528, a first inductor 504 on a first side of the PGS 528, a second inductor 532 on a second side of the PGS 528 and a first switch 516 coupled to a first portion of PGS 528. Turning to FIG. 4, a first semiconductor composite 550 comprising a first substrate 502, a first dielectric layer 503 and a first inductor 504 embedded in the first dielectric layer 503 is illustrated.

At 102, the first inductor 504 is formed in the first dielectric layer 503, as illustrated in FIG. 4. In some embodiments, the first inductor 504 is formed by creating a trench in the first dielectric layer 503, such as by etching, and at least one of depositing or growing a conductive material in the trench. In some embodiments, additional dielectric is then formed over the first inductor 504, such as by at least one of growth or deposition. In some embodiments, the first dielectric layer 503, including the additional dielectric formed over the first inductor 504 and thus also the intervening first inductor 504, has a thickness of between about 2.0 μm to about 8.0 μm. In some embodiments, the first dielectric layer 503 comprises at least one of silicon oxide ($SiO_2$) or silicon nitride ($Si_3N_4$). In some embodiments, the first dielectric layer 503 comprises an inter-layer dielectric (ILD), an inter-metal dielectric, or an undoped silicon glass (USG) layer. In some embodiments, the first inductor 504 has a thickness of between about 0.8 μm to about 4.0 μm. In some embodiments, a distance from the first inductor 504 through the first dielectric layer 503 to the first substrate 502 is between about 1.0 μm to about 2.5 μm.

Figure 5:
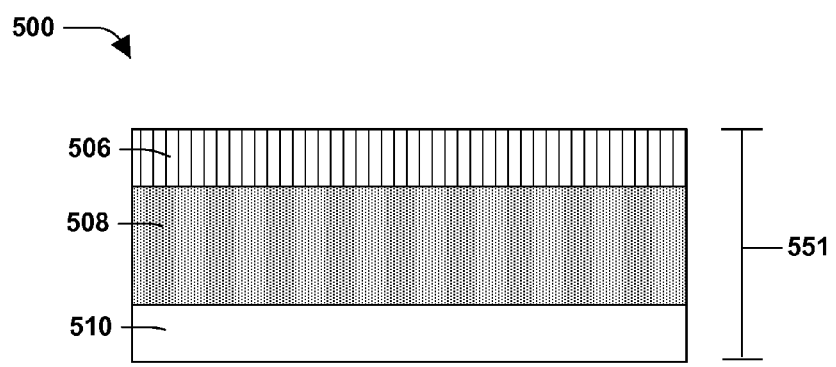
FIG. 5 is an illustration of a semiconductor device, according to some embodiments.
Figure 6:
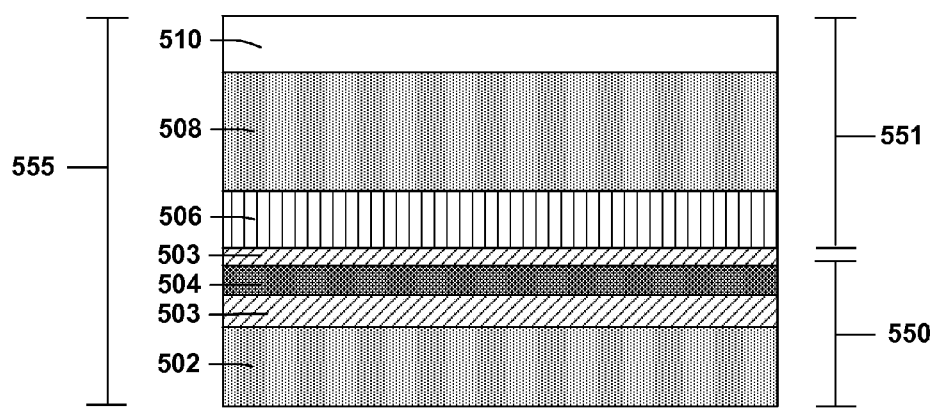
FIG. 6 is an illustration of a semiconductor device, according to some embodiments.

At 104, a second substrate 508 is formed over the first dielectric layer 503, as illustrated in FIGS. 5-6. In some embodiments, a switch, as provided herein, is understood with a formation as MOSFET or PN junctions or BJT (not shown). In some embodiments, a switch, as provided herein, needs voltage bias control to switch on or off or be activated or deactivated to at least one of selectively couple together portions of a PGS or to selectively couple one or more portions of a PGS to a voltage source. In some embodiments, a second semiconductor composite 551 comprising glue oxide 506, the second substrate 508, and a third substrate 510, as illustrated in FIG. 5, is inverted and placed over the first semiconductor composite 550, to comprise a first semiconductor arrangement 555, as illustrated in FIG. 6. In some embodiments, at least one of the first substrate 502, the second substrate 508 or the third substrate 510 have a thickness of between about 200 μm to about 700 μm. In some embodiments, at least one of the first substrate 502, the second substrate 508, the third substrate 510 or other substrates mentioned herein comprise an epitaxial layer, a silicon-on-insulator (SOI) structure, a wafer, or a die formed from a wafer. In some embodiments, at least one of the first substrate 502, the second substrate 508, the third substrate 510 or other substrates mentioned herein comprise at least one of silicon, silicon-germanium (SiGe) or polysilicon. In some embodiments, the glue oxide 506 adheres the second substrate 508 to the first dielectric layer 503. In some embodiments, the glue oxide 506 comprises an oxide. In some embodiments, the glue oxide 506 has a thickness of between about 10 μm to about 40 μm.

Figure 7:
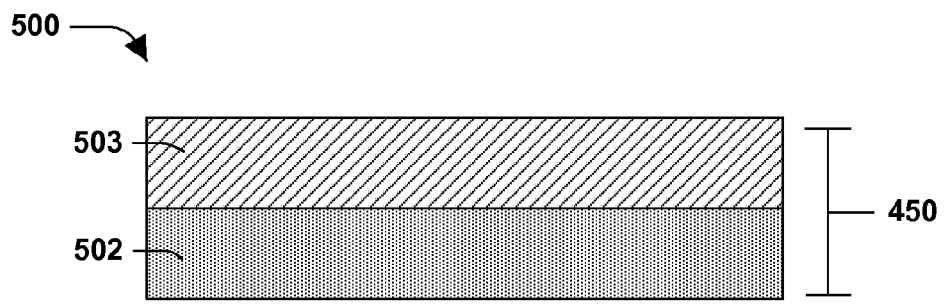
FIG. 7 is an illustration of a semiconductor device, according to some embodiments.
Figure 8:
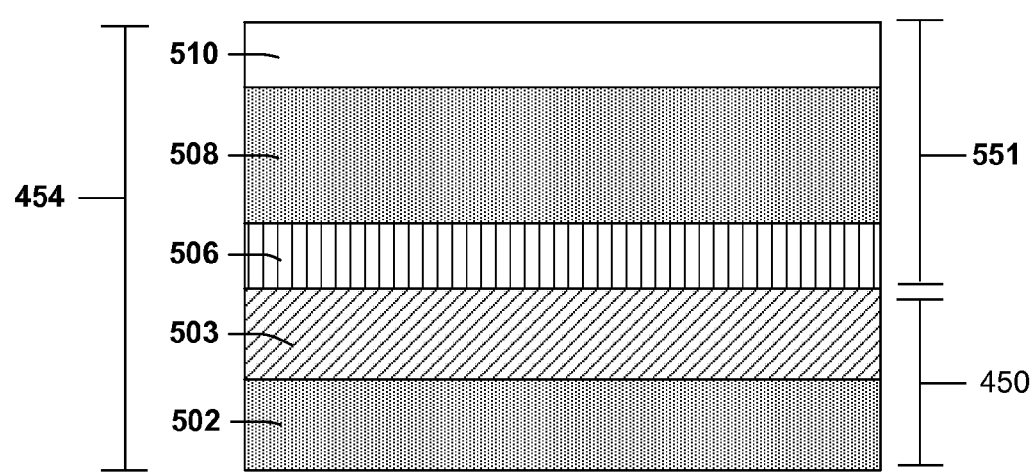
FIG. 8 is an illustration of a semiconductor device, according to some embodiments.

In some embodiments, the second semiconductor composite 551, as illustrated in FIG. 5, is inverted and placed over a third semiconductor composite 450, as illustrated FIG. 7, where the third semiconductor composite 450 comprises the first substrate 502 and the first dielectric layer 503, but without the first inductor 504 formed within the first dielectric layer 503, to form a second semiconductor arrangement 454, as illustrated in FIG. 8.

Figure 9:
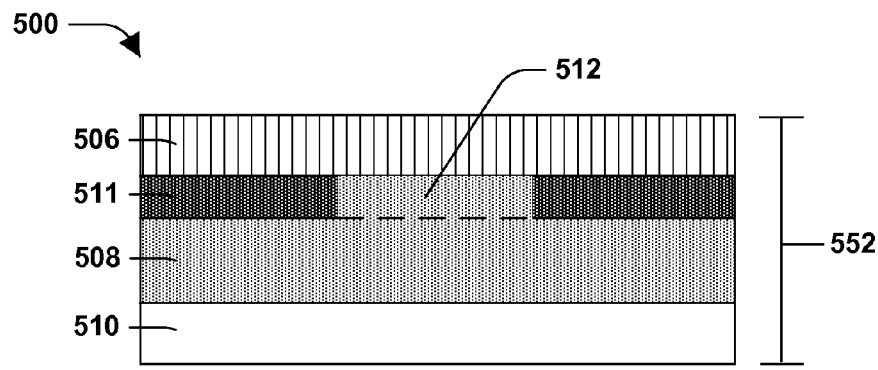
FIG. 9 is an illustration of a semiconductor device, according to some embodiments.
Figure 10:
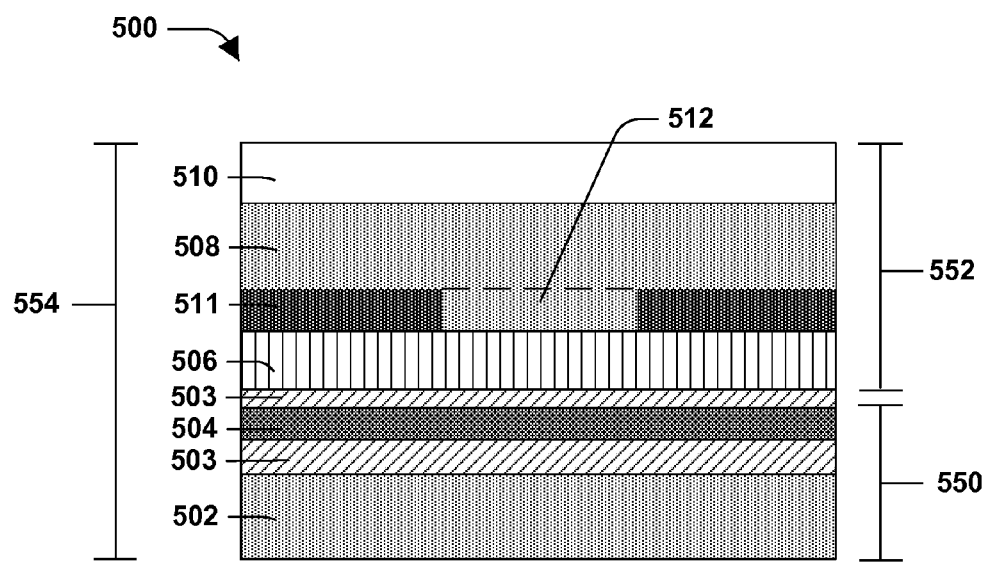
FIG. 10 is an illustration of a semiconductor device, according to some embodiments.

In some embodiments, a fourth semiconductor composite 552, as illustrated in FIG. 9, comprises the glue oxide 506, the second substrate 508, the third substrate 510 and a fourth substrate 512, where shallow trench isolation (STI) regions 511 are formed within the fourth substrate 512. In some embodiments, the fourth substrate 512 is a portion of the second substrate 508 wherein STI regions 511 are not formed. The fourth semiconductor composite 552 is placed over the first semiconductor composite 550, illustrated in FIG. 4, to form a third semiconductor arrangement 554, as illustrated in FIG. 10.

Figure 11:
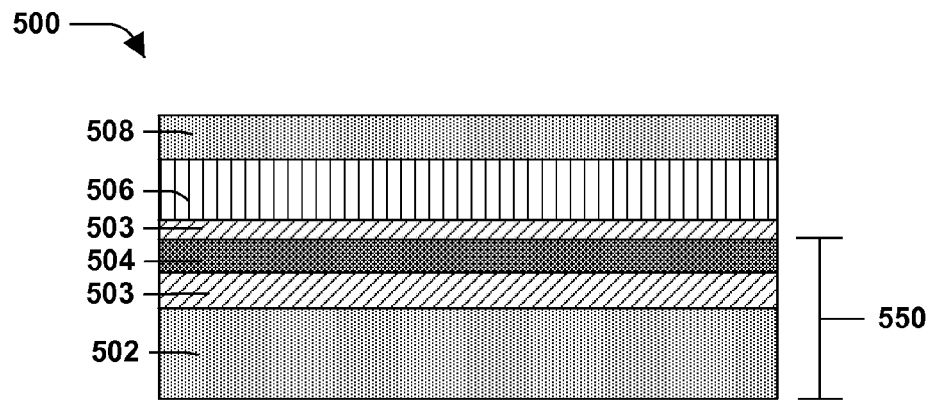
FIG. 11 is an illustration of a semiconductor device, according to some embodiments.
Figure 20:
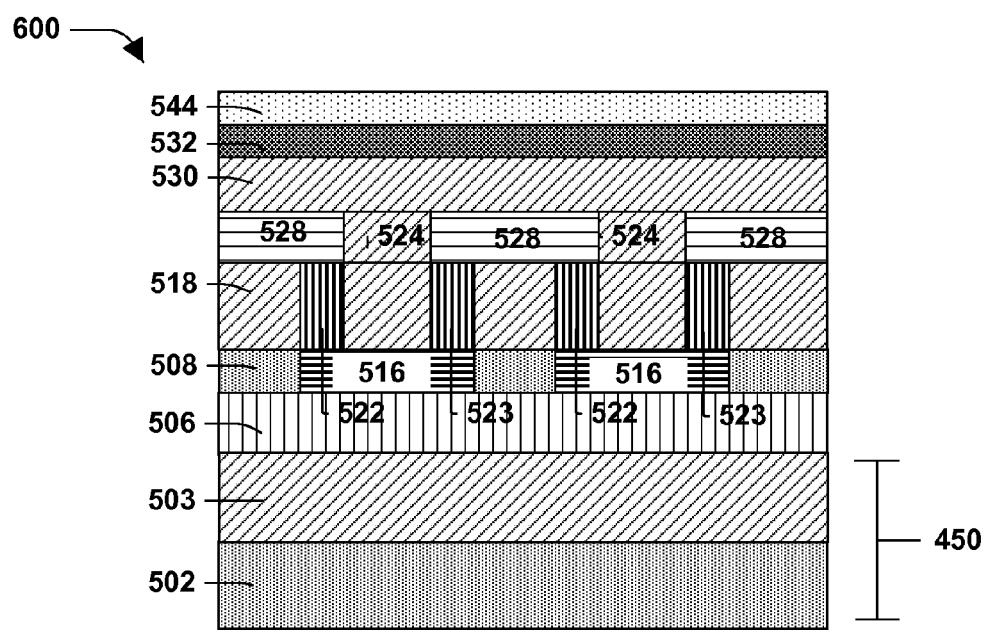
FIG. 20 is an illustration of a semiconductor device, according to some embodiments.
Figure 34:
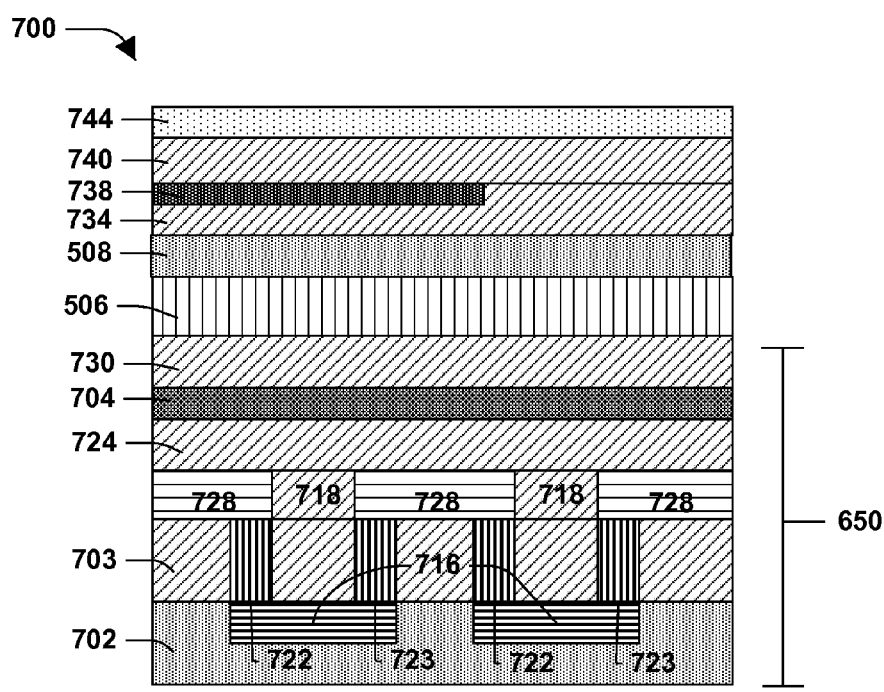
FIG. 34 is an illustration of a semiconductor device, according to some embodiments.
Figure 46:
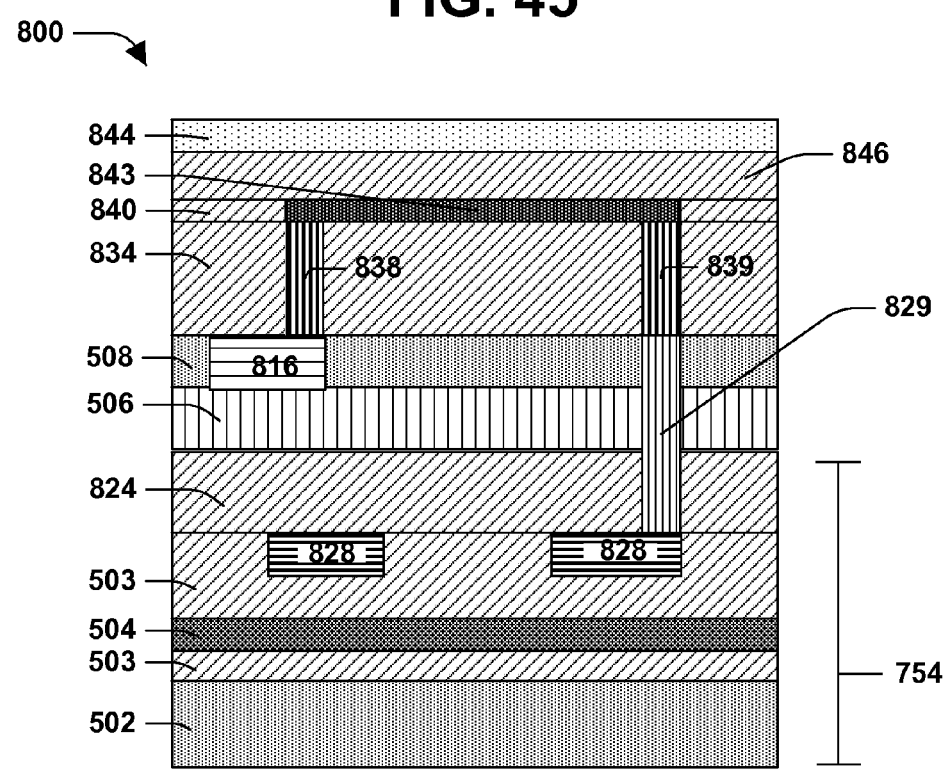
FIG. 46 is an illustration of a semiconductor device, according to some embodiments.

In some embodiments, the third substrate 510 and a portion of the second substrate 508 are removed, such as with $H_2$ or He, as illustrated in FIG. 11. In some embodiments, a horizontal or lateral fracture is introduced in the second substrate 508 to remove the portion of the second substrate, such as where the portion of the second substrate 508 that is removed corresponds to a portion of the second substrate 508 above the fracture in a direction away from the first substrate and towards the third substrate 510. Although removal of the third substrate 510 and a portion of the second substrate 508 within the second semiconductor composite 551, as illustrated in FIG. 6, of the first semiconductor arrangement 555 is illustrated in FIG. 11, at least one of removal of the third substrate 510 and a portion of the second substrate 508 within the second semiconductor composite 551, as illustrated in FIG. 8, of the second semiconductor arrangement 454 or removal of the third substrate 510 and a portion of the second substrate 508 within the fourth semiconductor composite 552, as illustrated in FIG. 10, of the third semiconductor arrangement 554 are contemplated, and resulting structure such as illustrated in FIG. 20, FIG. 34 and FIG. 46 indicate as much. In some embodiments, after the third substrate 510 and a portion of the second substrate 508 are removed, the second substrate 508 has a thickness of between about 200 µm to about 450 µm.

Figure 12:
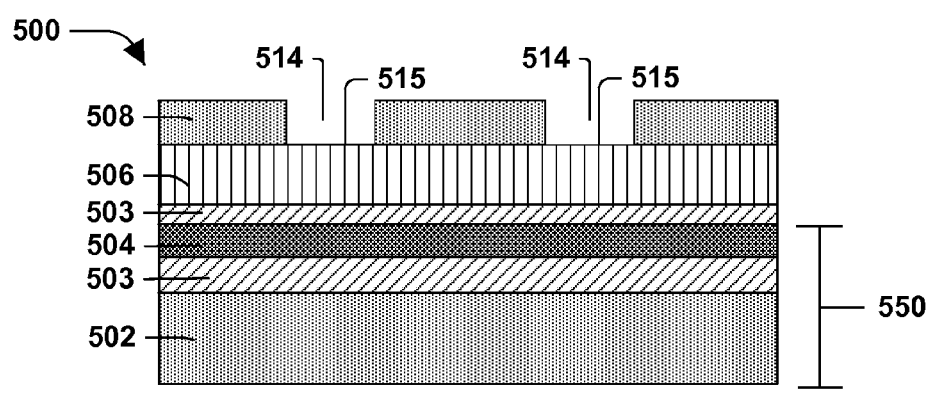
FIG. 12 is an illustration of a semiconductor device, according to some embodiments.

At 106, a first opening 514 is formed in the second substrate 508, as illustrated in FIG. 12. In some embodiments, the first opening 514 descends to the glue oxide surface 515. In some embodiments, the first opening 514 does not descend to the glue oxide surface 515. In some embodiments, the first opening 514 is formed by etching the second substrate 508, where unetched portions of the first semiconductor device 500 are masked off during the etching of the second substrate 508.

Figure 13:
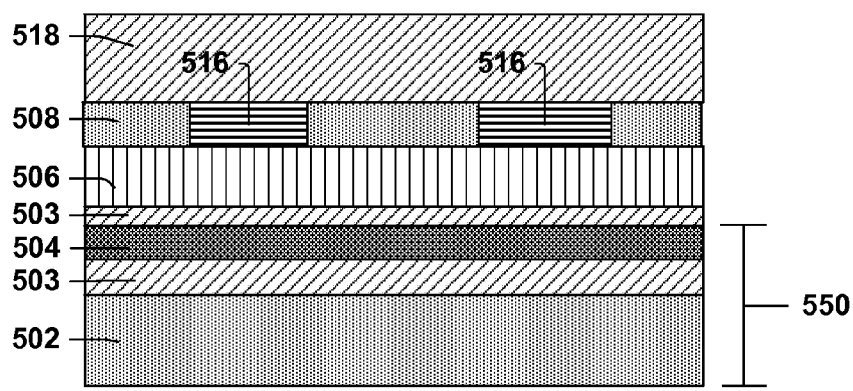
FIG. 13 is an illustration of a semiconductor device, according to some embodiments.

At 108, a first switch 516 is formed in the first opening 514, as illustrated in FIG. 13. In some embodiments, the first switch 516 comprises a conductive material. In some embodiments, the first switch 516 comprises at least one of metal or polysilicon. In some embodiments, the first switch 516 comprises at least one of copper or aluminum. In some embodiments, the first switch 516 has a thickness between about 0.8 µm to about 4.0 µm. In some embodiments, the first switch 516 has a width between about 0.4 µm to about 1.0 µm.

At 110, a second dielectric layer 518 is formed over the first switch 516 and the second substrate 508, as illustrated in FIG. 13. In some embodiments, the second dielectric layer 518 comprises one or more materials comprised in the first dielectric layer 503 described above, such as illustrated in FIG. 4.

Figure 14:
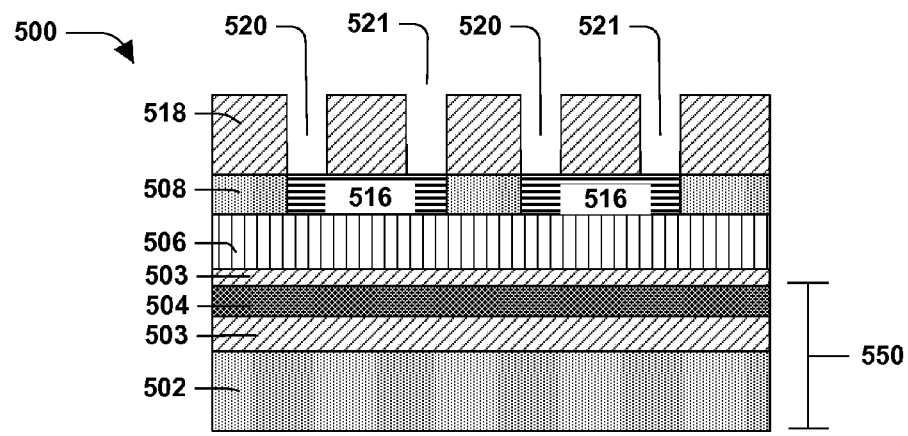
FIG. 14 is an illustration of a semiconductor device, according to some embodiments.

At 112, a second opening 520 and a third opening 521 are formed in the second dielectric layer 518 over the first switch 516, as illustrated in FIG. 14. In some embodiments, the second opening 520 and the third opening 521 are formed as described above with regard to the first opening 514, such as illustrated in FIG. 12. In some embodiments, the second opening 520 and the third opening 521 descend to the surface of the first switch 516. In some embodiments, a diffusion barrier, such as comprising an oxide liner, is formed in at least one of the second opening 520 or the third opening 521. In some embodiments, the diffusion barrier exists on sidewalls of the second dielectric layer 518 defining at least one of the second opening 520 or the third opening 521, such as after a directional etch is performed to remove the diffusion barrier from a bottom of at least one of the second opening 520 or the third opening 521.

Figure 15:
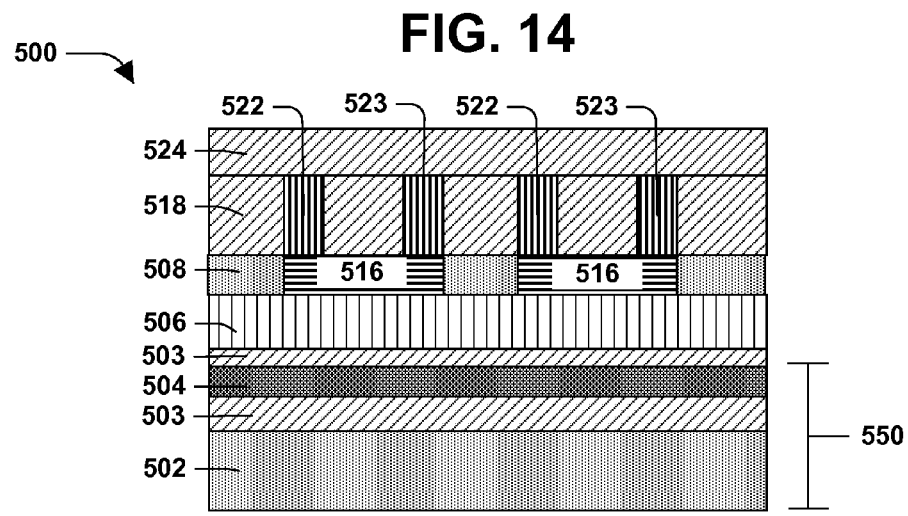
FIG. 15 is an illustration of a semiconductor device, according to some embodiments.

At 114, a first conductive element 522 is formed in the second opening 520, as illustrated in FIG. 15. In some embodiments, a second conductive element 523 is formed in the third opening 521. In some embodiments, at least one of the first conductive element 522 or the second conductive element 523 comprise a conductive material. In some embodiments, at least one of the first conductive element 522 or the second conductive element 523 comprise metal. In some embodiments, at least one of the first conductive element 522 or the second conductive element 523 comprise copper or aluminum. In some embodiments, at least one of the first conductive element 522 or the second conductive element 523 have a thickness between about 2.0 µm to about 4.0 µm. In some embodiments, at least one of the first conductive element or the second conductive element have a width between about 0.1 µm to about 0.4 µm.

At 116, a third dielectric layer 524 is formed over the first conductive element 522, the second conductive element 523, and the second dielectric layer 518, as illustrated in FIG. 15. In some embodiments, the third dielectric layer 524 comprises one or more materials comprised in the first dielectric layer 503 described above, such as illustrated in FIG. 4.

Figure 16:
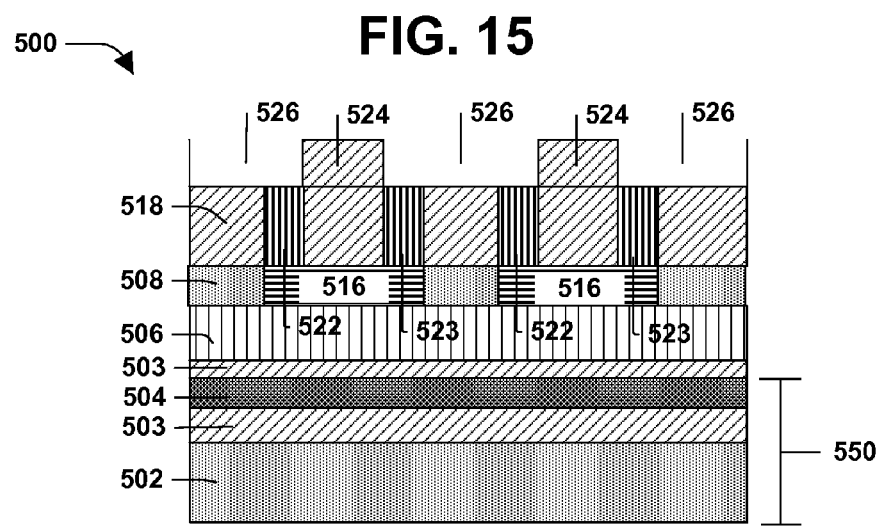
FIG. 16 is an illustration of a semiconductor device, according to some embodiments.

At 118, a fourth opening 526 is formed in the third dielectric layer 524 over a least one of the first conductive element 522 or the second conductive element 523, as illustrated in FIG. 16. In some embodiments, the fourth opening 526 is formed as described above with regard to the first opening 514, such as illustrated in FIG. 12.

Figure 17:
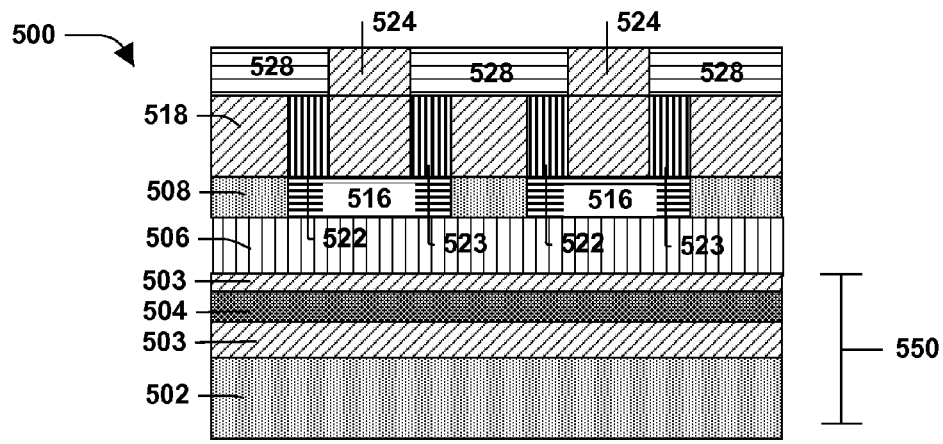
FIG. 17 is an illustration of a semiconductor device, according to some embodiments.

At 120, a first portion of the PGS 528 is formed in the fourth opening 526, as illustrated in FIG. 17. In some embodiments, the PGS 528 is deposited. In some embodiments, the PGS 528 comprises a metal. In some embodiments, the PGS 528 comprises at least one of copper or aluminum. In some embodiments, the PGS 528 has a thickness of between about 0.8 µm to about 4.0 µm. In some embodiments, a portion of the PGS 528 has a width of between about 0.4 µm to about 1.0 µm. In some embodiments, a first portion of PGS 528 is coupled to the first switch 516, through the first conductive element 522 or the second conductive element 523. In some embodiments, depending on a state of the first switch 516, such as on or off, the first switch 516 connects the a first portion of the PGS 528 to a second portion of the PGS 528, altering the behavior of the first inductor 504. In some embodiments, depending on a state of the first switch 516, such as on or off, the first switch 516 applies a voltage to or conducts current to the first portion of the PGS 528, altering the behavior of the first inductor 504.

Figure 18:
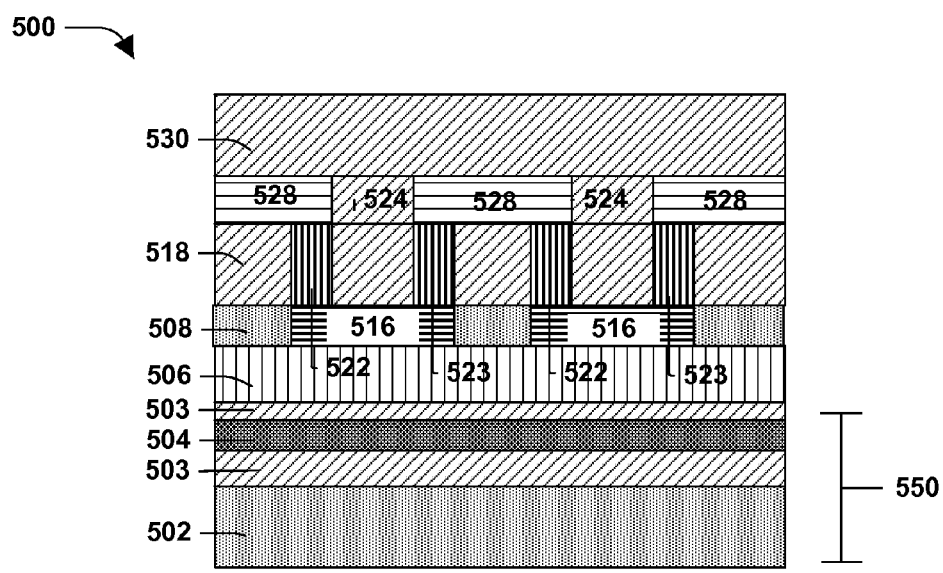
FIG. 18 is an illustration of a semiconductor device, according to some embodiments.
Figure 19:
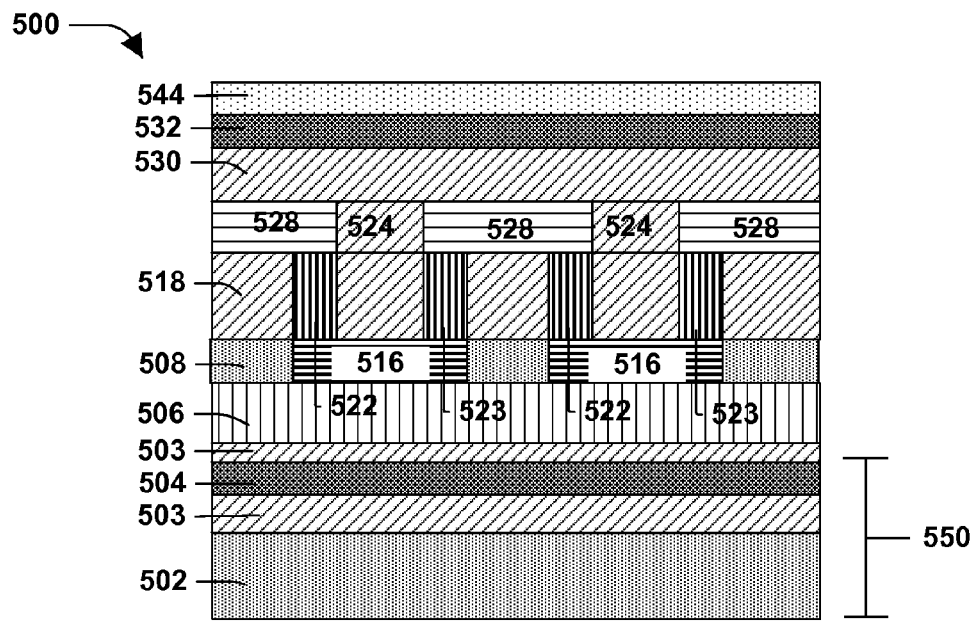
FIG. 19 is an illustration of a semiconductor device, according to some embodiments.

At 122, a second inductor 532 is formed on a fourth dielectric layer 530, as illustrated in FIGS. 18-19. In some embodiments, the fourth dielectric layer 530 comprises one or more materials comprised in the first dielectric layer 503 described above, such as illustrated in FIG. 4. In some embodiments, the fourth dielectric layer 530 is formed over the PGS 528 and the third dielectric layer 524. In some embodiments, the second inductor 532 is formed as described above with regard to the first inductor 504, such as illustrated in FIG. 4.

In some embodiments, a second semiconductor device 600 comprises the second inductor 532 but not the first inductor 504, as illustrated in FIG. 20. In some embodiments, the second semiconductor device 600 is formed using 106-122 of the first method 100. In some embodiments, the second semiconductor device 600 is formed with the third semiconductor composite 450, as illustrated in FIG. 8, instead of the first semiconductor composite 550, as illustrated in FIG. 6, where the first semiconductor composite 550 is used to form the first semiconductor device 500.

In some embodiments, a third semiconductor device (not shown) comprises STI regions 511, the first inductor 504 and the second inductor 532. In some embodiments, the third semiconductor device is formed using 102-122 of the first method 100. In some embodiments, the third semiconductor device is formed with the fourth semiconductor composite 552, as illustrated in FIG. 9, in place of the second semiconductor composite 551, as illustrated in FIG. 6. In some embodiments, PGS portions, switches, etc. are not formed in the STI regions 511.

In some embodiments, a fourth semiconductor device (not shown) comprises STI regions 511 and the second inductor, but not the first inductor. In some embodiments, the fourth semiconductor device is formed using 106-122 of the first method 100. In some embodiments, the fourth semiconductor device is formed with the fourth semiconductor composite 552, as illustrated in FIG. 9, in place of the second semiconductor composite 551, as illustrated in FIG. 6, and with the third semiconductor composite 450, as illustrated in FIG. 7, instead of the first semiconductor composite 550, as illustrated in FIG. 6. In some embodiments, PGS portions, switches, etc. are not formed in the STI regions 511.

In some embodiments, any number of inductors, PGS portions or switches are contemplated. Although not illustrated, any number of inductors are included in a semiconductor device, where at least one of the behavior of an inductor or the interaction between multiple inductors is affected by the selective coupling of portions of a PGS, such as by switches within the semiconductor device. Although not illustrated, any number of PGS portions are included in a semiconductor device where any number of PGS portions are selectively coupled together. In some embodiments, first and second portions of a PGS are coupled to one another, while third and fourth portions of the PGS are coupled to one another. In some embodiments, first, second and third portions of a PGS are coupled to one another. Although not illustrated, any number of switches are included in a semiconductor device to at least one of selectively couple together any number of PGS portions or apply a current or voltage to any number of PGS portions, where the same or different current or voltage is applied to different PGS portions, in some embodiments. In some embodiments, a first switch couples a first portion of a PGS to a second portion of the PGS, while a second switch applies a first current or voltage to a third portion of the PGS and a third switch applies a second current or voltage to a fourth portion of the PGS. In some embodiments, a first switch couples a first portion of a PGS to a second portion of the PGS, while a second switch applies a first current or voltage to at least one of the first portion of the PGS or the second portion of the PGS. In some embodiments, switches are connected to PGS portions in any number of ways, such as through at least one of one or more conductive elements, one or more interconnect metals or one or more conductive traces.

Figure 2:
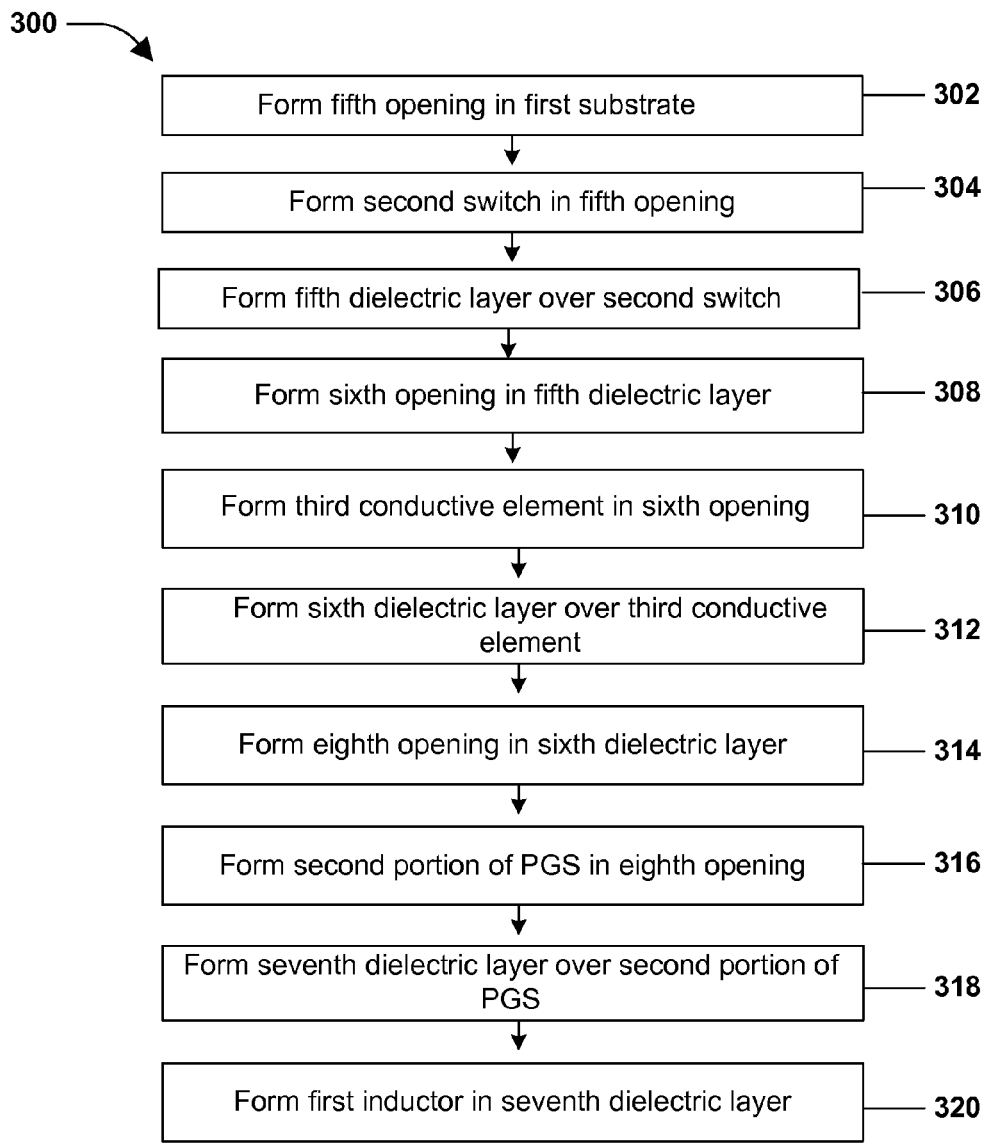
FIG. 2 is a flow diagram illustrating a method of forming a semiconductor device, according to some embodiments.
Figure 21:
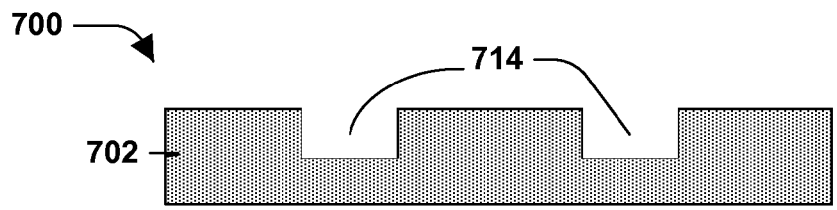
FIG. 21 is an illustration of a semiconductor device, according to some embodiments.

A second method 300 of forming a fifth semiconductor device 700 is illustrated in FIG. 2, and one or more semiconductor arrangements formed by such methodology are illustrated in FIGS. 21-34. As illustrated in FIG. 34, the fifth semiconductor device 700 comprises one or more portions of a patterned ground shielding (PGS) 728, a first inductor 704 and a second switch 716 coupled to a first portion of the PGS 728. Turning to FIG. 21, a first substrate 702 is illustrated.

At 302, a fifth opening 714 is formed in the first substrate 702, as illustrated in FIG. 21. In some embodiments, the fifth opening 714 is formed as described above with regard to the first opening 514, such as illustrated in FIG. 12.

Figure 22:
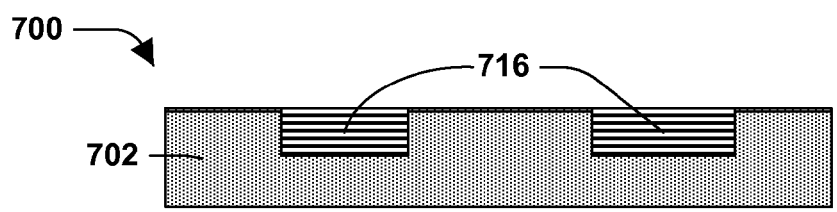
FIG. 22 is an illustration of a semiconductor device, according to some embodiments.

At 304, a second switch 716 is formed in the fifth opening 714, as illustrated in FIG. 22. In some embodiments, the second switch 716 is formed as described above with regard to the first switch 516, such as illustrated in FIG. 13.

Figure 23:
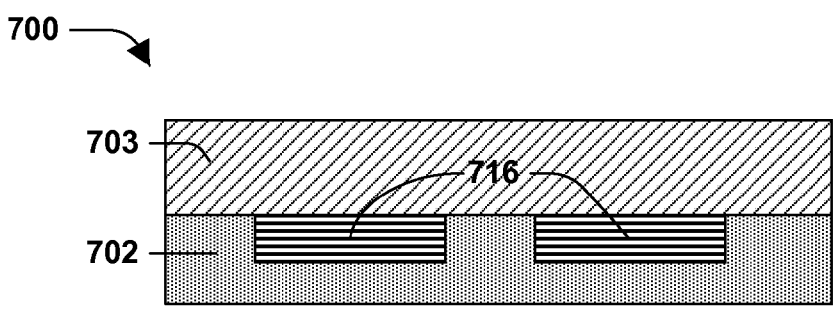
FIG. 23 is an illustration of a semiconductor device, according to some embodiments.

At 306, a fifth dielectric layer 703 is formed over the second switch 716 and the first substrate 702, as illustrated in FIG. 23. In some embodiments the fifth dielectric layer 703 comprises one or more materials comprised in the first dielectric layer 503 described above, such as illustrated in FIG. 4.

Figure 24:
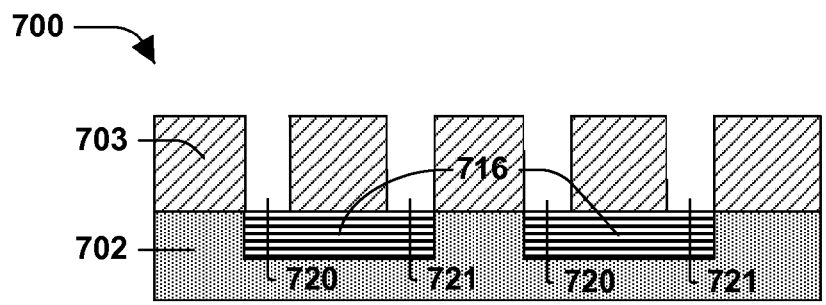
FIG. 24 is an illustration of a semiconductor device, according to some embodiments.

At 308, a sixth opening 720 and a seventh opening 721 are formed in the fifth dielectric layer 703, as illustrated in FIG. 24. In some embodiments, the sixth opening 720 and the seventh opening 721 are formed as described above with regard to the first opening 514, such as illustrated in FIG. 12.

Figure 25:
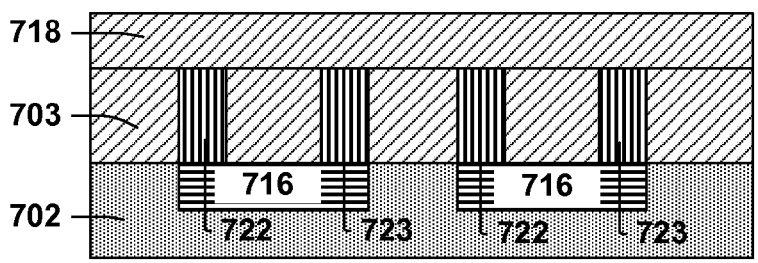
FIG. 25 is an illustration of a semiconductor device, according to some embodiments.

At 310, a third conductive element 722 is formed in the sixth opening 720. In some embodiments, a fourth conductive element 723 is formed in the seventh opening 721, as illustrated in FIG. 25. In some embodiments, the third conductive element 722 and the fourth conductive element 723 are formed as described above with regard to the first conductive element 522, such as illustrated in FIG. 15.

At 312, a sixth dielectric layer 718 is formed over the third conductive element 722, the fourth conductive element 723 and the fifth dielectric layer 703, as illustrated in FIG. 25. In some embodiments the sixth dielectric layer 718 comprises one or more materials comprised in the first dielectric layer 503 described above, such as illustrated in FIG. 4.

Figure 26:
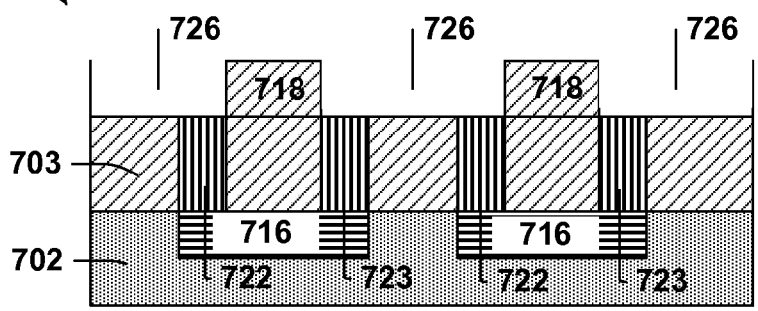
FIG. 26 is an illustration of a semiconductor device, according to some embodiments.

At 314, an eighth opening 726 is formed in the sixth dielectric layer 718, as illustrated in FIG. 26. In some embodiments, the eighth opening 726 is formed as described above with regard to the first opening 514, such as illustrated in FIG. 12.

Figure 27:
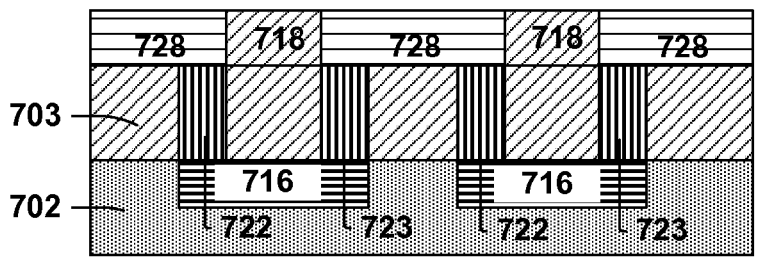
FIG. 27 is an illustration of a semiconductor device, according to some embodiments.

At 316, a first portion of the PGS 728 is formed in the eighth opening 726, as illustrated in FIG. 27. In some embodiments, the PGS 728 is formed as described above with regard to the PGS 528, such as illustrated in FIG. 17.

Figure 28:
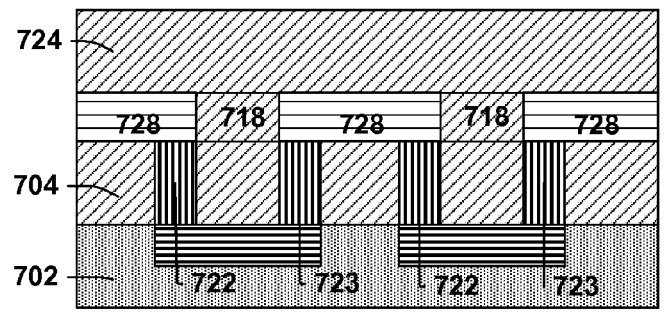
FIG. 28 is an illustration of a semiconductor device, according to some embodiments.

At 318, a seventh dielectric layer 724 is formed over the first portion of the PGS 728 and the sixth dielectric layer 718, as illustrated in FIG. 28. In some embodiments the seventh dielectric layer 724 comprises one or more materials comprised in the first dielectric layer 503 described above, such as illustrated in FIG. 4.

Figure 29:
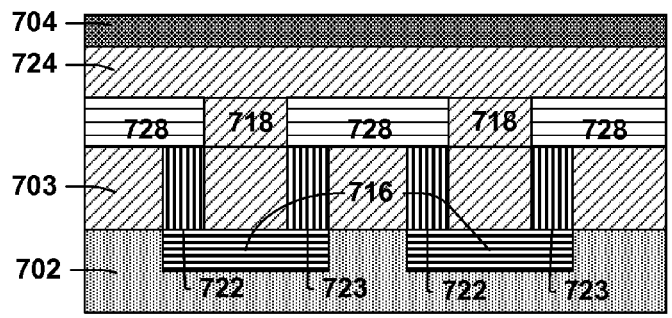
FIG. 29 is an illustration of a semiconductor device, according to some embodiments.
Figure 30:
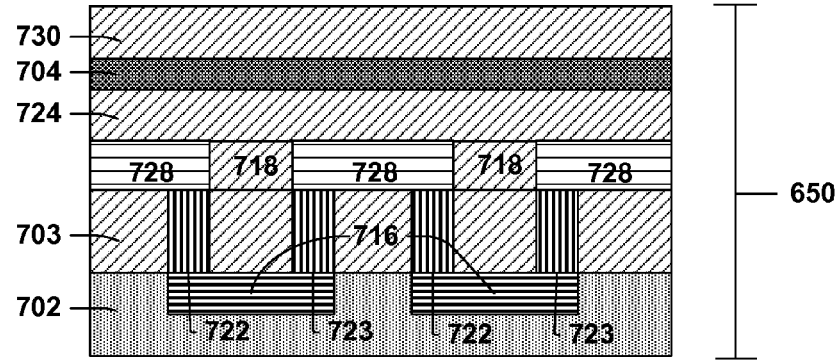
FIG. 30 is an illustration of a semiconductor device, according to some embodiments.

At 320, a first inductor 704 is applied to the seventh dielectric layer 724, as illustrated in FIG. 29. In some embodiments, the first inductor 704 is formed as described above, such as illustrated in FIG. 4. In some embodiments, an eighth dielectric layer 730 is formed over the first inductor 704, and a fifth semiconductor composite 650 is formed, as illustrated in FIG. 30. In some embodiments the eighth dielectric layer 730 comprises one or more materials comprised in the first dielectric layer 503 described above, such as illustrated in FIG. 4.

Figure 31:
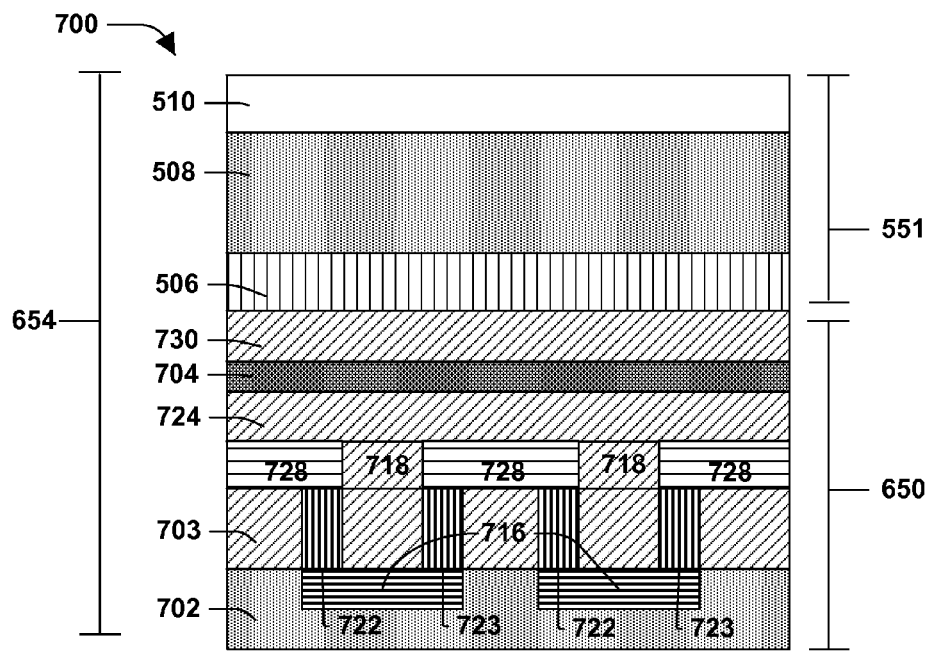
FIG. 31 is an illustration of a semiconductor device, according to some embodiments.

FIG. 31 illustrates the inversion and application of the second semiconductor composite 551, as illustrated in FIG. 6, to the fifth semiconductor composite 650 to form a fourth semiconductor arrangement 654.

Figure 32:
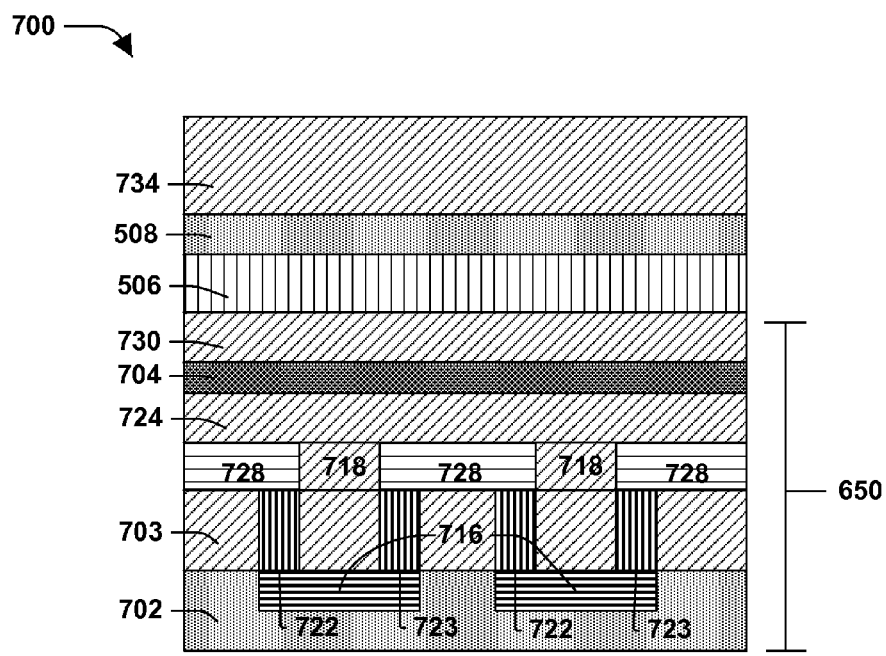
FIG. 32 is an illustration of a semiconductor device, according to some embodiments.

FIG. 32 illustrates the removal of the third substrate 510 and a portion of the second substrate 508, such as illustrated in FIG. 11 and the formation of a ninth dielectric layer 734 over the remaining second substrate 508. In some embodiments, the third substrate 510 and the portion of the second substrate 508 are removed as described above with regard to the first semiconductor device 500, such as illustrated in FIG. 11. In some embodiments the ninth dielectric layer 734 comprises one or more materials comprised in the first dielectric layer 503 described above, such as illustrated in FIG. 4.

Figure 33:
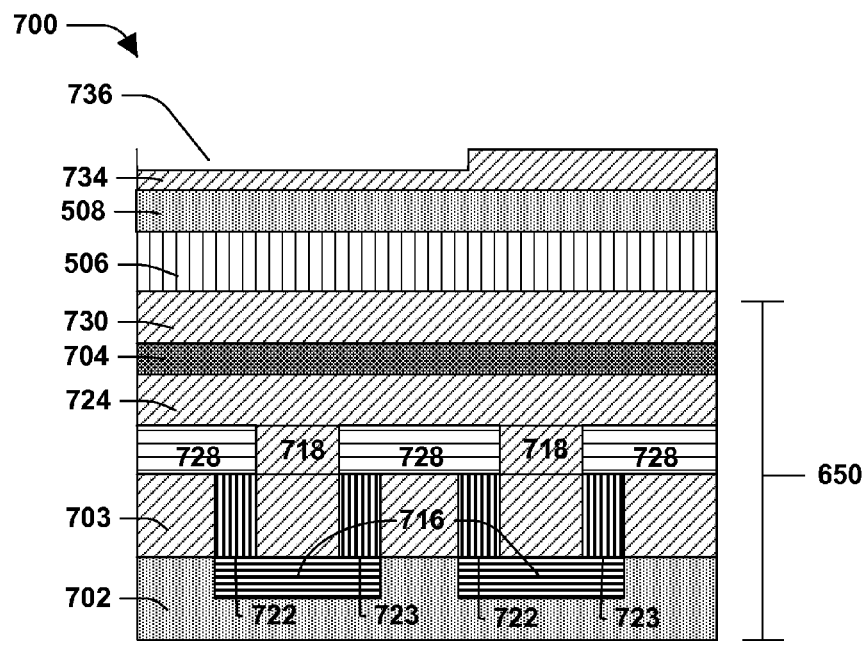
FIG. 33 is an illustration of a semiconductor device, according to some embodiments.

FIG. 33 illustrates the formation of a ninth opening 736 in the ninth dielectric layer 734. In some embodiments, the ninth opening 736 is formed as described above with regard to the first opening 514, such as illustrated in FIG. 12.

FIG. 34 illustrates the formation of a first interconnect metal 738 in the ninth opening 736. In some embodiments, the first interconnect metal 738 comprises a conductive material. In some embodiments, the first interconnect metal 738 is formed by at least one of deposition or growth. In some embodiments, the first interconnect metal is formed contemporaneously with the ninth dielectric layer 734. In some embodiments, a tenth dielectric layer 740 is formed over the first interconnect metal 738 and the ninth dielectric layer 734. In some embodiments, the tenth dielectric layer 740 comprises one or more materials comprised in the first dielectric layer 503 described above, such as illustrated in FIG. 4. In some embodiments, a passivation layer 744 is formed over the tenth dielectric layer 740. In some embodiments, the passivation layer 744 comprises at least one of a silicon oxide ($SiO_2$) or silicon nitride ($Si_3N_4$). As described above, depending on a state of the second switch 716, such as on or off, the second switch 716 connects, through the third conductive element 722 and the fourth conductive element 723, a first portion of the PGS 728 to a second portion of the PGS 728, altering the behavior of the first inductor 704. In some embodiments, depending on a state of the second switch 716, such as on or off, the second switch 716 applies a voltage to or conducts current to the first portion of the PGS 728, altering the behavior of the first inductor 704.

Figure 3:
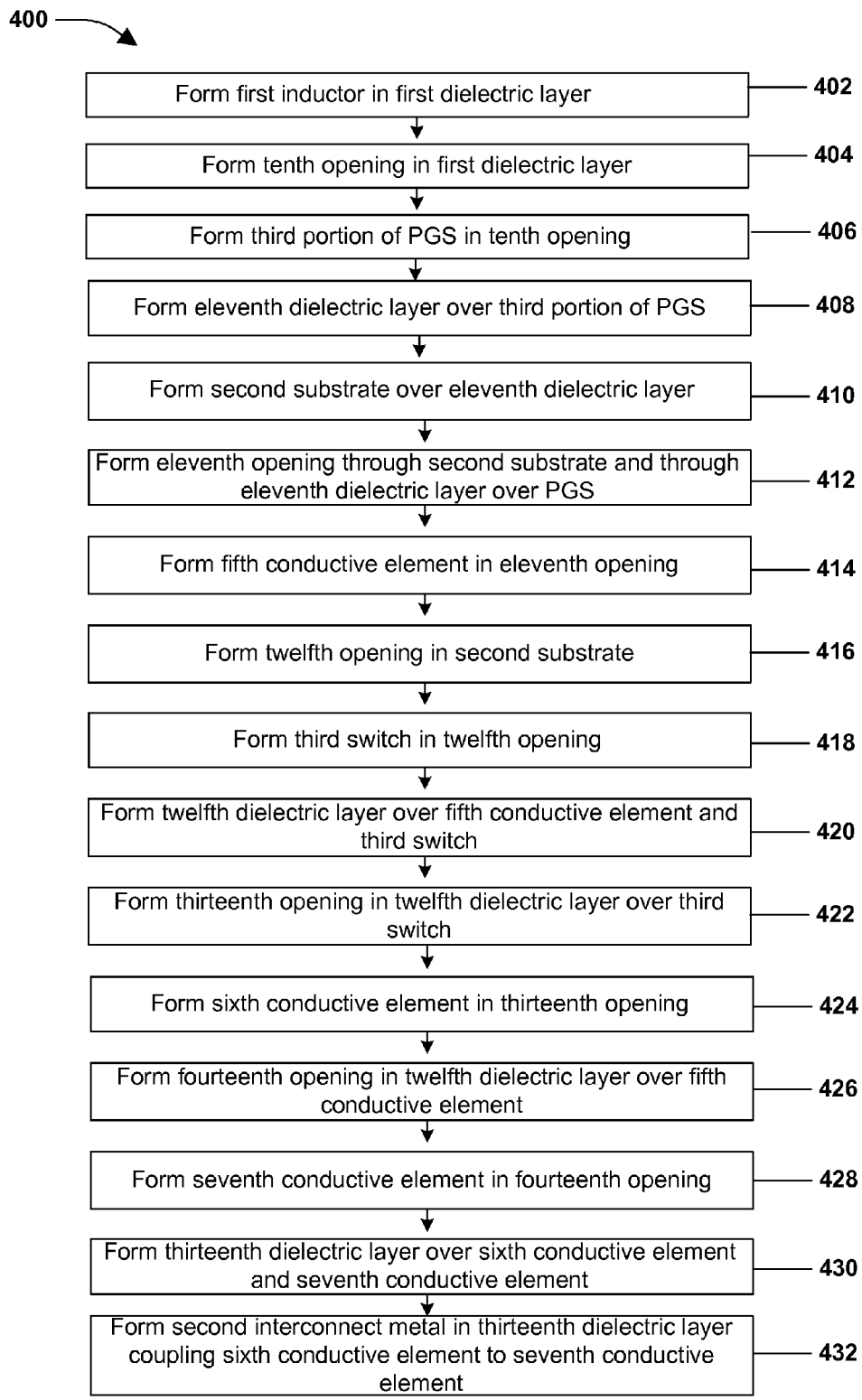
FIG. 3 is a flow diagram illustrating a method of forming a semiconductor device, according to some embodiments.
Figure 35:
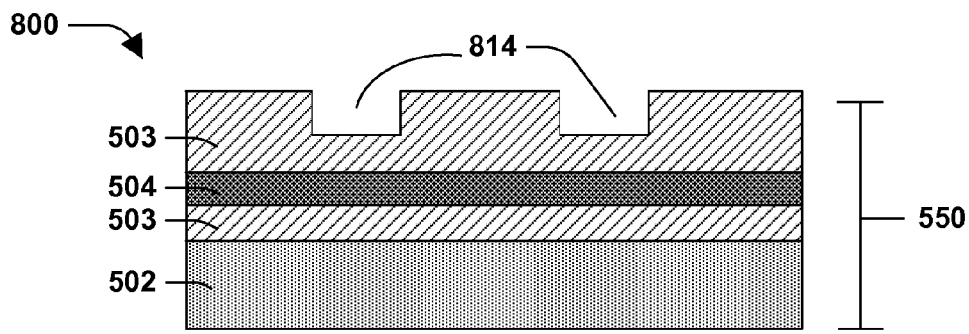
FIG. 35 is an illustration of a semiconductor device, according to some embodiments.

A third method 400 of forming a sixth semiconductor device 800 is illustrated in FIG. 3, and one or more semiconductor arrangements formed by such methodology are illustrated in FIGS. 35-46. As illustrated in FIG. 46, the sixth semiconductor device 800 comprises the first inductor 504, one or more portions of a patterned ground shielding (PGS) 828 and a third switch 816 coupled via an interconnect metal 843 to a first portion of PGS 828. Turning to FIG. 35, the first semiconductor composite 550 is illustrated.

At 402, the first semiconductor composite 550 comprising the first substrate 502, the first dielectric layer 503 and the first inductor 504 embedded in the first dielectric layer 503 is formed, such described above with regard to 102 and as illustrated in FIG. 4.

At 404, a tenth opening 814 is formed in the first dielectric layer 503. In some embodiments, the tenth opening 814 is formed as described above with regard to the first opening 514, such as illustrated in FIG. 12.

Figure 36:
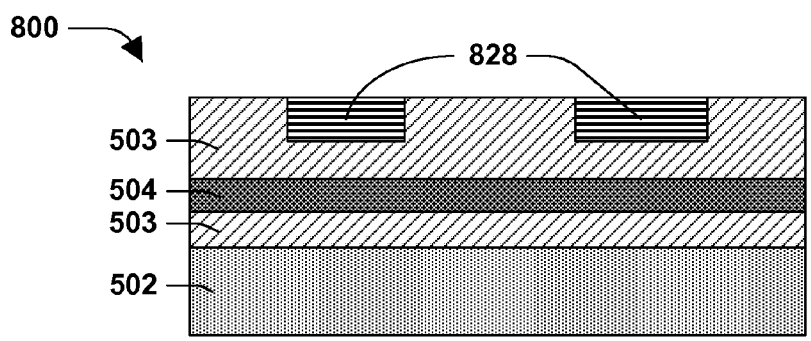
FIG. 36 is an illustration of a semiconductor device, according to some embodiments.

At 406, a first portion of the PGS 828 is formed in the tenth opening 814, as illustrated in FIG. 36. In some embodiments, the PGS 828 is formed as described above with regard to the PGS 528, such as illustrated in FIG. 17.

Figure 37:
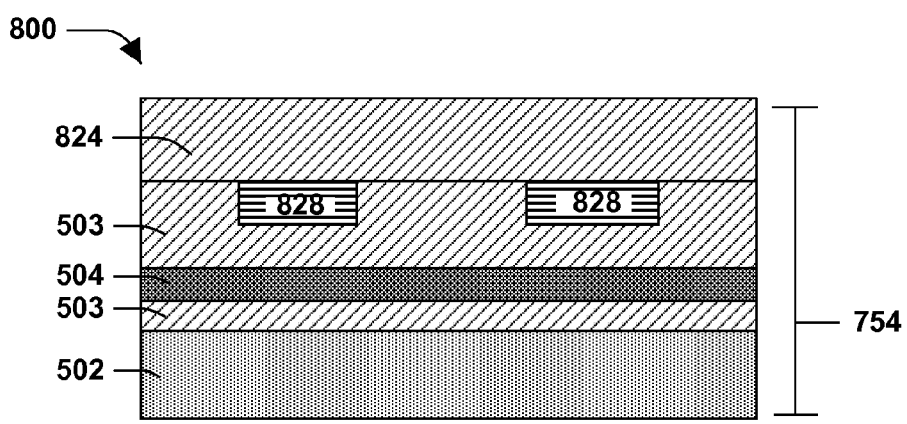
FIG. 37 is an illustration of a semiconductor device, according to some embodiments.

At 408, an eleventh dielectric layer 824 is formed over the first portion of the PGS 828 and the second dielectric layer 503, as illustrated in FIG. 37. In some embodiments the eleventh dielectric layer 824 comprises one or more materials comprised in the first dielectric layer 503 described above, such as illustrated in FIG. 4. In some embodiments, a sixth semiconductor composite 754 is formed.

Figure 38:
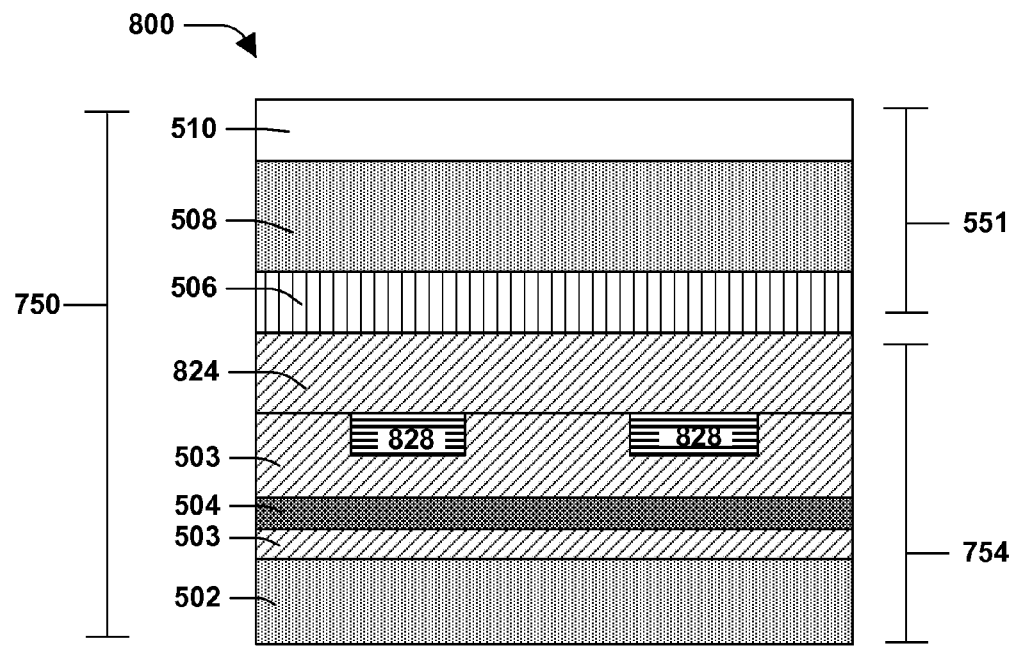
FIG. 38 is an illustration of a semiconductor device, according to some embodiments.
Figure 39:
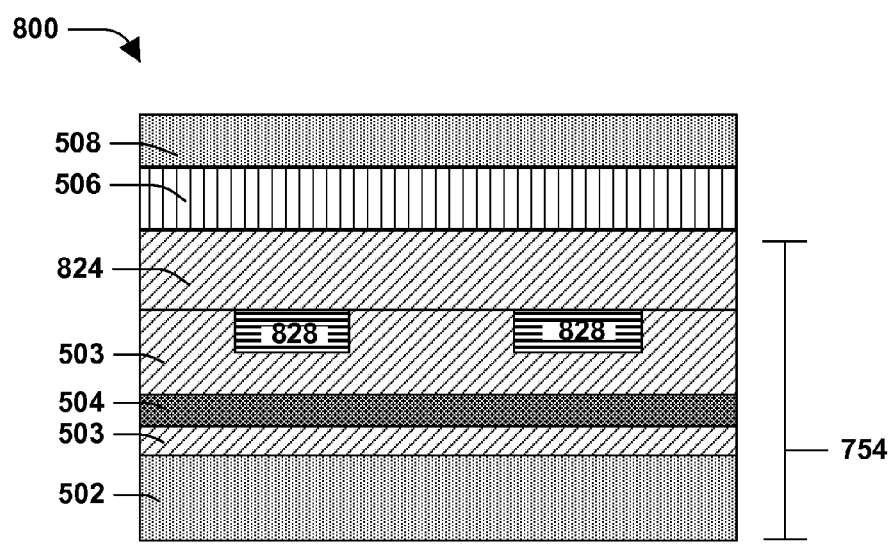
FIG. 39 is an illustration of a semiconductor device, according to some embodiments.

At 410, a second substrate 508 is formed over the sixth semiconductor composite 754 and thereby over the eleventh dielectric layer 824, as illustrated in FIG. 38. In some embodiments, the second semiconductor composite 551, as illustrate in FIG. 5, is inverted and applied to the sixth semiconductor composite 754 forming a fifth semiconductor arrangement 750. In some embodiments, the third substrate 510 and a portion of the second substrate 508 are removed, as illustrated in FIG. 39. In some embodiments, the third substrate 510 and the portion of the second substrate 508 are removed as described above with regard to the first semiconductor device 500, such as illustrated in FIG. 11.

Figure 40:
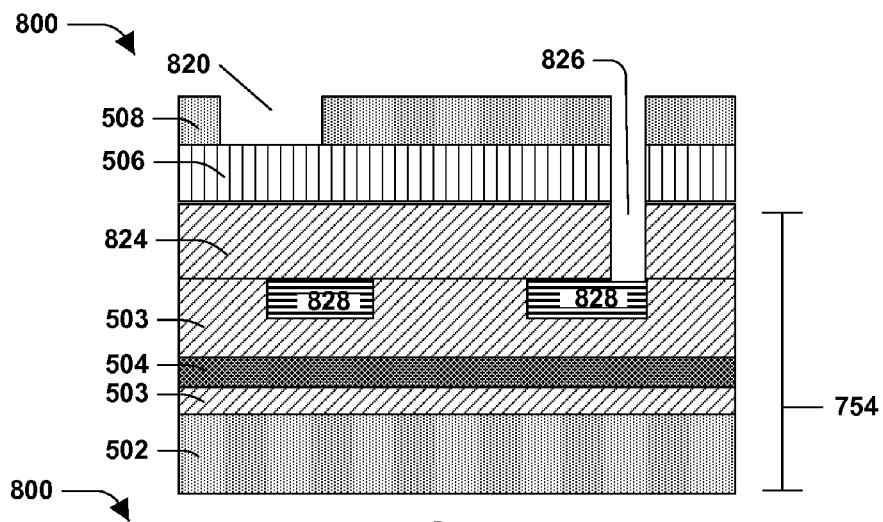
FIG. 40 is an illustration of a semiconductor device, according to some embodiments.

At 412, an eleventh opening 826 is formed through the second substrate 508, the glue oxide 506, and the eleventh dielectric layer 824 over the first portion of the PGS 828, as illustrated in FIG. 40. In some embodiments, the eleventh opening 826 is formed as described above with regard to the first opening 514, such as illustrated in FIG. 12.

Figure 41:
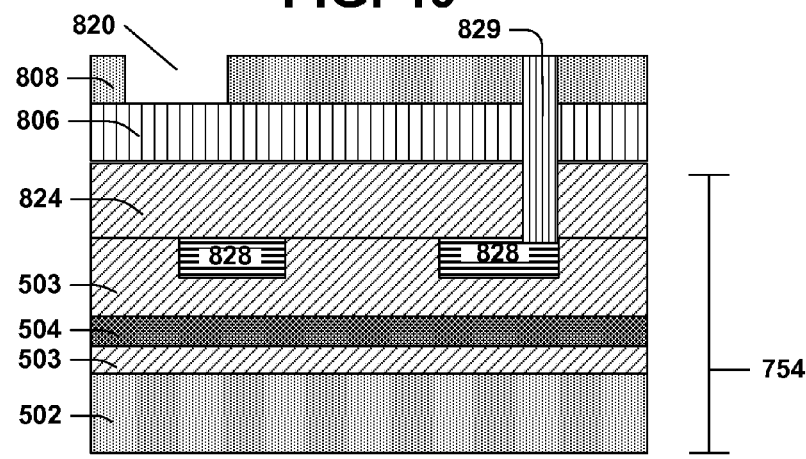
FIG. 41 is an illustration of a semiconductor device, according to some embodiments.

At 414, a fifth conductive element 829 is formed in the eleventh opening 826, as illustrated in FIG. 41. In some embodiments, the fifth conductive element 829 is formed as described above with regard to the first conductive element 522, such as illustrated in FIG. 15.

At 416, a twelfth opening 820 is formed through the second substrate 508, as illustrated in FIG. 40. In some embodiments, the twelfth opening 820 is formed as described above with regard to the first opening 514, such as illustrated in FIG. 12.

Figure 42:
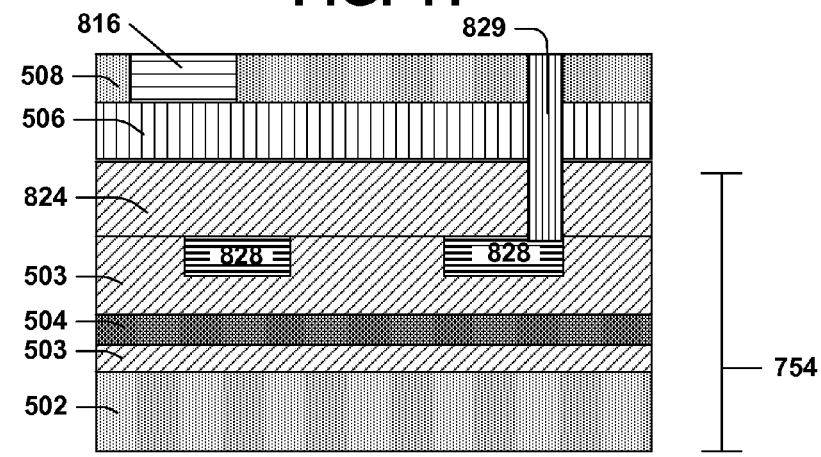
FIG. 42 is an illustration of a semiconductor device, according to some embodiments.

At 418, a third switch 816 is formed in the twelfth opening 820, as illustrated in FIG. 42. In some embodiments, the third switch 816 is formed as described above with regard to the first switch 516, such as illustrated in FIG. 13.

Figure 43:
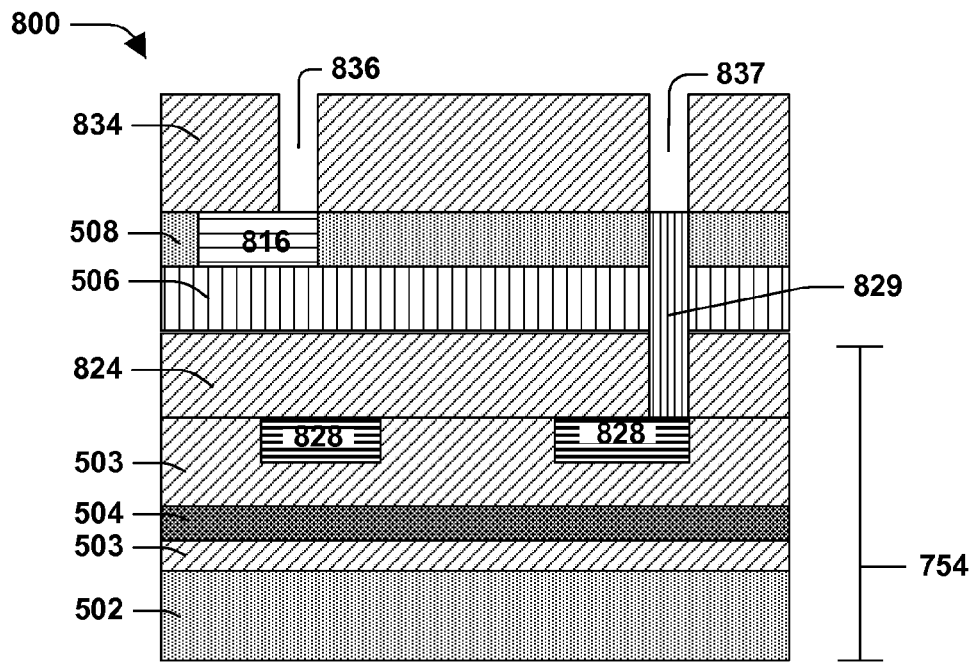
FIG. 43 is an illustration of a semiconductor device, according to some embodiments.

At 420, a twelfth dielectric layer 834 is formed over the second substrate 508, the fifth conductive element 829 and the third switch 816, as illustrated in FIG. 43. In some embodiments the twelfth dielectric layer 834 comprises one or more materials comprised in the first dielectric layer 503 described above, such as illustrated in FIG. 4.

At 422, a thirteenth opening 836 is formed over the third switch 816, and at 426, a fourteenth opening 837 is formed over the fifth conductive element 829 in the twelfth dielectric layer 834, as illustrated in FIG. 43. In some embodiments, the thirteenth opening 836 and the fourteenth opening 837 are formed as described above with regard to the first opening 514, such as illustrated in FIG. 12.

Figure 44:
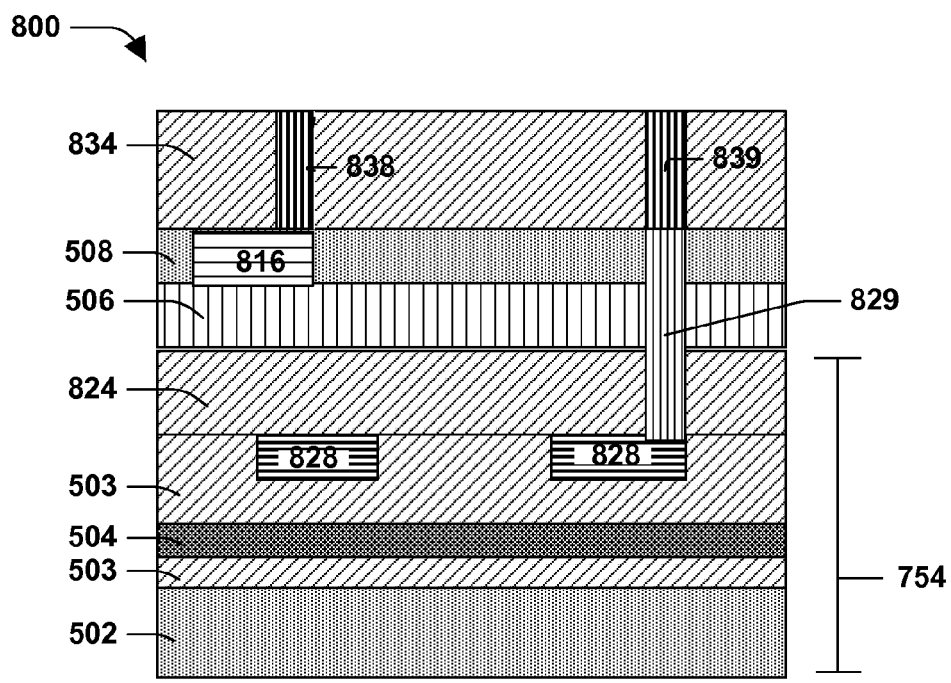

At 424, a sixth conductive element 838 is formed in the thirteenth opening 836, and at 428, a seventh conductive element 839 is formed in the fourteenth opening 837, as illustrated in FIG. 44. In some embodiments, the sixth conductive element 838 and the seventh conductive element 839 are formed as described above with regard to the first conductive element 522, such as illustrated in FIG. 15.

Figure 45:
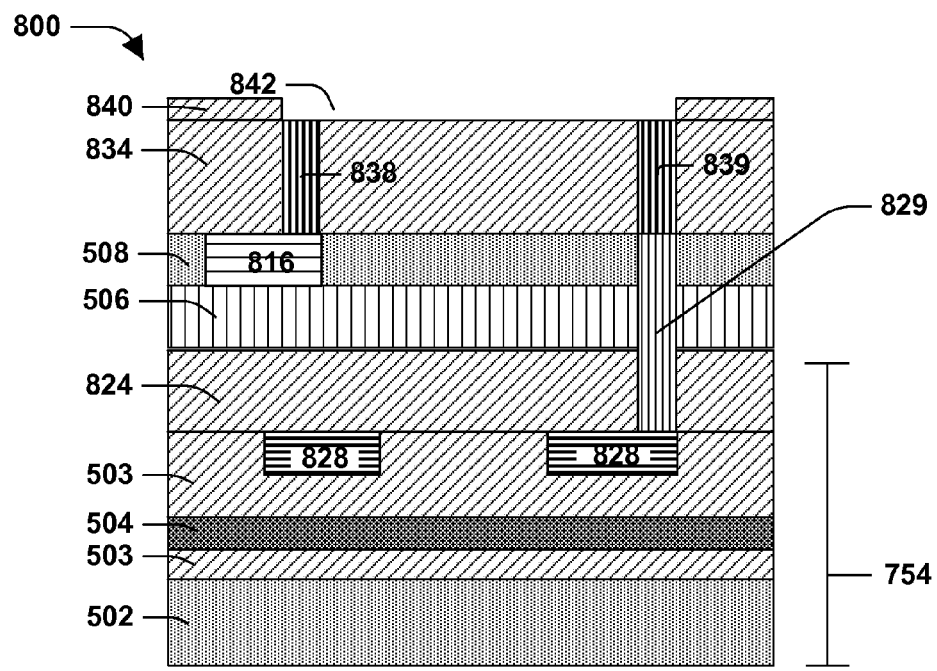
FIG. 45 is an illustration of a semiconductor device, according to some embodiments.

At 430, a thirteenth dielectric layer 840 is formed over the twelfth dielectric layer 834, the sixth conductive element 838 and the seventh conductive element 839, as illustrated in FIG. 45. In some embodiments the thirteenth dielectric layer 840 comprises one or more materials comprised in the first dielectric layer 503 described above, such as illustrated in FIG. 4.

At 432, a second interconnect metal 843 is formed that couples the sixth conductive element 838 to the seventh conductive element 839, as illustrated in FIG. 46. In some embodiments, the second interconnect metal 843 is formed as described above with regard to the first interconnect metal 738, such as illustrated in FIG. 34. In some embodiments, a sixteenth opening 842 is formed in the thirteenth dielectric layer 840 that extends between the sixth conductive element 838 and the seventh conductive element 839, as illustrated in FIG. 45. In some embodiments, the second interconnect metal 843 is formed in the sixteenth opening 842. In some embodiments, a fourteenth dielectric layer 846 is formed over the second interconnect metal 843 and the thirteenth dielectric layer 840. In some embodiments the fourteenth dielectric layer 846 comprises one or more materials comprised in the first dielectric layer 503 described above, such as illustrated in FIG. 4. In some embodiments, a passivation layer 844 is formed over the fourteenth dielectric layer 846, as illustrated in FIG. 46. In some embodiments, depending on a state of the third switch 816, such as on or off, the third switch 816 applies, through the sixth conductive element 838, the second interconnect metal 843, the seventh conductive element 839 and the fifth conductive element 829, a voltage to or conducts current to the first portion of the PGS 828, altering the behavior of the first inductor 504.

In some embodiments, a semiconductor device comprises a first inductor, a PGS proximate the inductor, the PGS comprising one or more portions, and a first switch configured to couple a first portion of the PGS to a second portion of the PGS.

In some embodiments, a method of forming a semiconductor comprises forming a first switch to couple a first portion of a PGS to a second portion of the PGS.

In some embodiments, a semiconductor device comprises a first inductor on a first side of a PGS, a second inductor on a second side of the PGS and a first switch configured to couple a first portion of the PGS to a second portion of the PGS.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a first inductor;
   a patterned ground shielding (PGS) underlying the first inductor, the PGS comprising a first portion and a second portion;
   a first switch for electrically coupling the first portion of the PGS to the second portion of the PGS, wherein the first switch underlies the PGS and the first portion of the PGS is electrically coupled to the second portion of the PGS when the first switch is in a first state;
   a conductive element coupling the first switch to the first portion of the PGS, wherein the conductive element is situated between the PGS and the first switch;
   a glue oxide layer underlying the first switch;
   a first dielectric layer underlying the glue oxide layer; and
   a second inductor underlying the first dielectric layer.

2. The semiconductor device of claim 1, wherein a top surface of the first dielectric layer is in direct contact with the glue oxide layer and a bottom surface of the first dielectric layer is in direct contact with the second inductor.

3. The semiconductor device of claim 2, comprising a substrate in which the first switch is situated, wherein a to surface of the glue oxide layer is in direct contact with the substrate.

4. The semiconductor device of claim 1, comprising a substrate in which the first switch is situated, wherein a top surface of the glue oxide layer is in direct contact with the substrate and a bottom surface of the glue oxide layer is in direct contact with the first dielectric layer.

5. The semiconductor device of claim 1, comprising a second dielectric layer underlying the first inductor and overlying the PGS.

6. The semiconductor device of claim 1, comprising a second dielectric layer situated between the first switch and the PGS, wherein the conductive element extends through the second dielectric layer.

7. The semiconductor device of claim 1, comprising a second switch for electrically coupling the second portion of the PGS to a third portion of the PGS.

8. The semiconductor device of claim 1, comprising a dielectric region having a first sidewall in contact with a sidewall of the first portion of the PGS and a second sidewall in contact with a sidewall of the second portion of the PGS.

9. A semiconductor device, comprising:
   a first inductor;
   a first dielectric layer in direct contact with a bottom surface of the first inductor;

a patterned ground shielding (PGS) in direct contact with a bottom surface of the first dielectric layer, the PGS comprising a first portion and a second portion;

a first switch configured to couple the first portion of the PGS to the second portion of the PGS, wherein the first switch is situated in a substrate that underlies the PGS and the first portion of the PGS is electrically coupled to the second portion of the PGS when the first switch is in a first state;

a glue oxide layer in direct contact with a bottom surface of the substrate;

a second dielectric layer in direct contact with a bottom surface of the glue oxide layer; and a second inductor in direct contact with a bottom surface of the second dielectric layer.

10. The semiconductor device of claim 9, comprising a second switch configured to couple the second portion of the PGS to a third portion of the PGS.

11. The semiconductor device of claim 9, wherein the first inductor, the first dielectric layer, the PGS, and the first switch are formed as a first composite, the second dielectric layer and the second inductor are formed as a second composite, and the glue oxide layer is situated between the first composite and the second composite.

12. The semiconductor device of claim 9, comprising a dielectric region having a first sidewall in contact with a sidewall of the first portion of the PGS and a second sidewall in contact with a sidewall of the second portion of the PGS.

13. The semiconductor device of claim 9, comprising a third dielectric layer situated between the PGS and the first switch.

14. The semiconductor device of claim 13, comprising a conductive element coupling the first switch to the first portion of the PGS, the conductive element extending through the third dielectric layer.

15. The semiconductor device of claim 9, comprising a third dielectric layer having a top surface in direct contact with a bottom surface of the PGS and a bottom surface in direct contact with a top surface of the substrate.

16. A semiconductor device, comprising:

a first inductor;

a pattern ground shield (PGS) comprising a first portion and a second portion;

a switch for electrically coupling the first portion of the PGS to the second portion of the PGS, wherein the switch is situated in a substrate;

a glue oxide layer underlying the switch and in direct contact with the substrate;

a first dielectric layer underlying the glue oxide layer and in direct contact with the glue oxide layer; and a second inductor underlying the first dielectric layer.

17. The semiconductor device of claim 16, wherein the second inductor is in direct contact with the first dielectric layer.

18. The semiconductor device of claim 16, comprising a second dielectric layer between the first inductor and the PGS.

19. The semiconductor device of claim 16, comprising a second dielectric layer between the PGS and the substrate, the second dielectric layer in direct contact with the PGS and the substrate.

20. The semiconductor device of claim 16, comprising a dielectric region having a first sidewall in contact with a sidewall of the first portion of the PGS and a second sidewall in contact with a sidewall of the second portion of the PGS.

* * * * *